(12) United States Patent
Khan (10) Patent No.: US 7,215,146 B2
(45) Date of Patent: May 8, 2007

(54) HIGH SPEED BUFFERED LEVEL-UP SHIFTERS

(75) Inventor: Naveed Khan, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 31 days.

(21) Appl. No.: 10/977,146

(22) Filed: Oct. 29, 2004

(65) Prior Publication Data

US 2006/0091907 A1    May 4, 2006

(51) Int. Cl.
*H03K 19/175* (2006.01)

(52) U.S. Cl. .............................. 326/83; 326/81; 326/68

(58) Field of Classification Search ............ 326/68–74, 326/80–87
See application file for complete search history.

(56) References Cited

U.S. PATENT DOCUMENTS

| | | | |
|---|---|---|---|
| 5,300,835 A | | 4/1994 | Assar et al. |
| 5,736,869 A | * | 4/1998 | Wei .............................. 326/81 |
| 6,130,556 A | * | 10/2000 | Schmitt et al. ............... 326/81 |
| 6,266,001 B1 | | 7/2001 | Fang et al. |
| 6,774,698 B1 | * | 8/2004 | Bhattacharya et al. ...... 327/333 |
| 6,801,064 B1 | * | 10/2004 | Hunt et al. ................... 327/112 |
| 7,068,074 B2 | * | 6/2006 | Bhattacharya et al. ........ 326/63 |

OTHER PUBLICATIONS

Motorola, MECL Intergrated Circuits Databook prepared by Technical Informationa Center, "Quad MECL to TTL Translator"; 1983, pp. 3-47 through 3-49.
William R. Blood, Jr., Motorola, Inc., MECL Handbook, 1988, Fourth Edition, pp. 207-215.

* cited by examiner

*Primary Examiner*—Don Le
(74) *Attorney, Agent, or Firm*—Derek J. Reynolds (57) ABSTRACT

Embodiments of the invention include apparatus with a level-up shifter including a comparator having a pair of cross coupled PFETs with sources coupled to an I/O power supply and gates coupled to each other's drain, and a differential pair of NFETs with sources coupled to ground and gates respectively coupled to a data input and an inverted data input; and first and second pull-up PFETs have sources coupled to a pull-up voltage and drains respectively coupled between the differential pair of NFETs and the pair of cross coupled PFETs. The cross coupled PFETs and differential pair of NFETs perform level translation of low swing logic levels at the data input to high swing logic levels on a drain of one of the cross-coupled PFETs, while first and second pull-up PFETs speed the level translation in response to the data input and the inverted data input.

37 Claims, 5 Drawing Sheets

HIGH SPEED BUFFERED LEVEL-UP SHIFTERS

FIELD

Embodiments of the invention relate generally to logic level translators, and specifically to level-up shifters used to translate logic levels and drive data out from an integrated circuit.

BACKGROUND

Transistor channel lengths have become smaller to increase circuit density and to improve switching performance in integrated circuits. Power supply voltages have also been reduced to improve switching performance of transistors in integrated circuits. To accommodate the lower power supply voltages, transistors have been designed with lower threshold voltages for the gate-to-source voltage for which transistors turn-on. These transistors utilize a reduced logic swing between voltages that represent a logical one and a logical zero. That is, the difference between a minimum voltage representing a logical one and the maximum voltage representing a logical zero is reduced.

For example, the maximum voltage representing a logical zero may be 500 millivolts (mv) and the minimum voltage representing a logical one may be 2.4 volts (v) at the input/output interface to a packaged integrated circuit for a power supply of 3.3 volts. To speed logic switching internally, the maximum voltage representing a logical zero may be 100 millivolts and the minimum voltage representing a logical one may be 800 millivolts for a power supply of 1.25 volts, for example. With a reduced power supply, circuitry need only logically swing 700 millivolts in contrast to logically swinging one-thousand nine-hundred millivolts (e.g., 1.9 volts). Thus, lowering the power supply may increase performance if a transistor is compensated with smaller channel lengths and appropriate turn-on threshold voltages.

However, many other circuits (including other integrated circuits) that interface externally to an integrated circuit still require a larger logic swing, such as a maximum logical zero voltage of 500 millivolts and the minimum logical one voltage of 2.4 volts for a power supply of 3.3 volts. In which case, level translators are used to translate one set of logic levels to another.

One level translator may be formed out of a differential comparator having a differential input. A data input with one logic level is coupled to a first input of the comparator and an inverted data input is coupled to a second input of the comparator. As the comparator is provided with a power supply associated with a second set of logic levels with a swing greater than the first, the comparator can translate the logic levels at its inputs into the second logic levels at its output. The comparator may be a complementary metal oxide semiconductor comparator and use n-channel field effect transistors (NFETs) in a differential pair configuration to provide the differential input to the comparator. The comparator may further include a pair of cross-coupled p-channel field effect transistors (PFETs) to pull-up the output of the comparator to the logical one level of the second set of logic levels. The comparator may further include a cascode NFET and a cascode PFET in series together in each differential leg between the NFET of the differential pair and the PFET of the cross-coupled pull-up. However the cascode NFET and the cascode PFET can slow down the level translation and delay the output response. This is not acceptable in high speed integrated circuits.

DETAILED DESCRIPTION

In the following detailed description of embodiments of the invention, numerous specific details are set forth to provide a thorough understanding of the embodiments of the invention. However, it should be clear to one skilled in the art that the embodiments of the invention may be practiced without these specific details. In other instances well known methods, procedures, components, and circuits have not been described in detail to avoid unnecessarily obscuring aspects of the embodiments of the invention.

Generally, embodiments of the invention use pull-up transistors just above the pull-down transistors in each stage of a level-up shifter to speed the pull-up of an intermediate node. If the intermediate node is pulled-up more quickly in one leg of a differential stage, a cascaded N-channel field effect transistor (NFET) is effectively turned off sooner. Turning off the cascaded NFET sooner reduces the capacitive load on a cascaded P-channel field effect transistor (PFET) and a cross coupled pull-up transistor in series there-with to speed up the level shifter. In the opposite leg of the differential stage.

In one embodiment of the invention, a level-up shifter is provided including a comparator and first and second pull-up p-channel field effect transistors (PFETs). The comparator has a pair of cross coupled PFETs and a differential pair of NFETs. The sources of the pair of cross coupled PFETs are coupled to an I/O power supply (e.g., IOVDD), drains are coupled to the other's gate. One drain of the pair of cross coupled PFETs may serve as an output from the comparator. The sources of the differential pair of NFETs are coupled to ground (e.g., VSS), the gates are respectively coupled to a data input and an inverted data input, and the drains couple to the drains of the pair of cross coupled PFETs. The cross coupled PFETs and the differential pair of NFETs level translate low swing logic levels (e.g., between VSS and CVDD) at the data input to high swing logic levels (e.g., between VSS and IOVDD) on a node between the pair of cross coupled PFETs and the differential pair of NFETs. The first and second pull-up PFETs have sources coupled to a pull-up voltage supply (e.g., VPU), drains respectively coupled between the drains of the differential pair of NFETs and the drains of the pair of cross coupled PFETs. The first and second pull-up PFETs speed the level translation of the data input into the node in response to the data input and the inverted data input. The comparator may further have a pair of cascode PFETs coupled between the cross coupled PFETs and the differential pair of NFETs. The pair of cascode PFETs are biased ON by a first bias voltage (e.g., Pbias). The comparator may further have a pair of cascode NFETs coupled between the pair of cascode PFETs and the differential pair of NFETs. The pair of cascode NFETs are biased ON by a second bias voltage (e.g., Nbias) with each being selectively turned OFF by the respective first and second pull-up PFETs in response to the data input and the inverted data input being at a logic low level. The level up shifter may further include one or more of a bias circuit, a buffer, an output driver, and an inverter. The bias circuit can generate the first bias voltage and the second bias voltage. The buffer has an input coupled to the drain of one of the pair of cross coupled PFETs and a buffered output to buffer a load on the buffered output from the drain of one of the pair of cross coupled PFETs. The output driver has an input coupled to the output of the buffer and a driver output coupled to a pad of an integrated circuit to drive the pad with the high swing logic levels. The inverter has an input coupled to the data input and an output coupled to the inverted data input. The inverter inverts the low swing logic levels of the data input to generate inverted data input with low swing logic levels. In one embodiment of the invention, the pull-up voltage supply is a positive power supply voltage for core logic of an integrated circuit having a voltage level less than a voltage level of the I/O power supply.

In another embodiment of the invention, a level up shifter is provided including a pair of cross coupled PFETs, a pair of cascode PFETs, a pair of cascode NFETs, a differential pair of NFETs, and first and second pull-up PFETs. The pair of cross coupled PFETs have their sources coupled to an I/O power supply (e.g., IOVDD) and gates cross coupled to each others drains. The pair of cascode PFETs have their sources coupled respectively to the drains of the cross coupled PFETs and their gates coupled to a first bias voltage. The pair of cascode NFETs have their drains respectively coupled to the drains of the pair of cascode PFETs and their gates coupled to a second bias voltage. The differential pair of NFETs have their drains respectively coupled to the sources of the pair of cascode NFETs, their sources coupled to ground (e.g., VSS), with one of their gates coupled to a data input, and the other gate coupled to an inverted data input. The first and second pull-up PFETs have their drains respectively coupled to the drains of the differential pair of NFETs, their sources coupled to a pull-up voltage supply (e.g., VPU), with one of their gates coupled to the data input, and the other gate coupled to the inverted data input. The logic levels of the data input have a lower range of swing than the logic levels that are generated at a pair of intermediate nodes where the drains of the pair of cascode PFETs and the drains of the pair of cascode NFETs respectively couple together. The first pull-up PFET has its gate coupled to the data input to pull-up on one of the sources of the pair of cascode NFETs and turn it OFF in response to the data input being at a logic low level. The second pull-up PFET has its gate coupled to the inverted data input to pull-up on the other one of the sources of the pair of cascode NFETs and turn it OFF in response to the inverted data input being at a logic low level. The level-up shifter may further include a buffer and an output driver. The buffer has an input coupled to the drain of one of the pair of cross coupled PFETs and an output that buffers a load on the output from its input. The output driver has an input coupled to the output of the buffer and an output coupled to a pad of an integrated circuit. The buffer may include a first PFET, a first cascode PFET, a first cascode NFET, a first pull-down NFET, and a third pull-up PFET. The first PFET has a source coupled to the I/O power supply (e.g., IOVDD) and a gate coupled to the drain of one of the pair of cross coupled PFETs. The first cascode PFET has a source coupled to the drain of the first PFET and a gate coupled to the first bias voltage. The first cascode NFET has a drain coupled to the drain of the first cascode PFET and a gate coupled to the second bias voltage. The first pull-down NFET has a drain coupled to the source of the first cascode NFET, a source coupled to ground (e.g., VSS), and a gate coupled to the drain of one of the differential pair of NFETs. The third pull-up PFET has a drain coupled to the drain of the first pull-down NFET, a source coupled to the pull-up voltage supply (e.g., VPU), and a gate coupled to the drain of the one of the differential pair of NFETs. The buffer may further include a second PFET, a second cascode PFET, a second cascode NFET, a second pull-down NFET, and a fourth pull-up PFET. The second PFET has a source coupled to the I/O power supply (e.g., IOVDD) and a gate coupled to the drain of the first PFET of the buffer. The second cascode PFET has a source coupled to the drain of the second PFET and a gate coupled to the first bias voltage. The second cascode NFET has a drain coupled to the drain of the second cascode PFET and a gate coupled to the second bias voltage. The second pull-down NFET has a drain coupled to the source of the second cascode NFET, a source coupled to ground (e.g., VSS), and a gate coupled to the drain of the first pull-down NFET. The fourth pull-up PFET has a drain coupled to the drain of the second pull-down NFET, a source coupled to the pull-up voltage supply, and a gate coupled to the drain of the first pull-down NFET. The output driver may include a third PFET, a third cascode PFET, a third cascode NFET, a third pull-down NFET, and a fifth pull-up PFET. The third PFET has a source coupled to the I/O power supply (e.g., IOVDD) and a gate coupled to the drain of the second PFET of the buffer. The third cascode PFET has a source coupled to the drain of the third PFET and a gate coupled to the first bias voltage. The third cascode NFET has a drain coupled to the drain of the third cascode PFET and a gate coupled to the second bias voltage. The third pull-down NFET has a drain coupled to the source of the third cascode NFET, a source coupled to ground (e.g., VSS), and a gate coupled to the drain of the second pull-down NFET. The fifth pull-up PFET has a drain coupled to the drain of the third pull-down NFET, a source coupled to the pull-up voltage supply (e.g., VPU), and a gate coupled to the drain of the second pull-down NFET. In the level-up shifter, the pull-up voltage (e.g., VPU) may be a core power supply voltage (e.g., CVDD) for core logic circuitry of an integrated circuit that has a voltage level less than a voltage level of the I/O power supply (e.g., IOVDD).

In another embodiment of the invention, an integrated circuit is provided that includes core logic circuitry, input/output circuitry, and a buffered level-up shifter. The core logic circuitry has a core power supply (e.g., CVDD) to generate signals with zero and one logic levels having a low voltage swing. The input/output circuitry has an I/O power supply (e.g., IOVDD) to drive out signals from the integrated circuit with zero and one logic levels having a high voltage swing greater than the low voltage swing of the signals generated by the core logic circuitry. The buffered level-up shifter is coupled between the core logic circuitry and the input/output circuitry. The buffered level up shifter includes a comparator, a first pull-up PFET and a second pull-up PFET. The comparator has a pair of cross coupled PFETs (e.g., a first and second PFET with the gate of the first PFET coupled to the drain of the second PFET and the gate of the second PFET coupled to the drain of the first PFET)

and a differential pair of NFETs (e.g., a first NFET and a second NFET with sources coupled together). The pair of cross coupled PFETs have their with sources coupled to the I/O power supply and their gates cross coupled to each other's drain. A drain of one of the pair of cross coupled PFETs may be an output of the comparator. The differential pair of NFETs have their sources coupled to ground, their drains respectively coupled to the drains of the pair of cross coupled PFETs, and their gates respectively coupled to a data input and an inverted data input. The cross coupled PFETs and the differential pair of NFETs level translate the data input with zero and one logic levels having the low voltage swing to zero and one logic levels having the high voltage swing on a node between the pair of cross coupled PFETs and the differential pair of NFETs. The first pull-up PFET has its source coupled to a pull-up voltage supply, its gate coupled to the data input, and its drain coupled to the drain of one of the differential pair of NFETs at a first intermediate node between one of the pair of cross coupled PFETs and the one of the differential pair of NFETs. The second pull-up PFET has its source coupled to the pull-up voltage supply, its gate coupled to the inverted data input, and its drain coupled to the drain of another one of the differential pair of NFETs at a second intermediate node between another one of the pair of cross coupled PFETs and the another one of the differential pair of NFETs. The first pull-up PFET and the second pull-up PFET speed the level translation of the data input onto the output in response to the data input and the inverted data input, respectively. The pull-up voltage may simply be set to the core power supply which has a voltage level less than the voltage level of the I/O power supply. The comparator of the buffered level up shifter may further include a pair of cascode PFETs and a pair of cascode NFETs. The pair of cascode PFETs is coupled between the cross coupled PFETs and the differential pair of NFETs and are biased ON by a first bias voltage. The pair of cascode NFETs are coupled between the pair of cascode PFETs and the differential pair of NFETs. The pair of cascode NFETs may be biased ON by a second bias voltage or selectively turned OFF respectively by the first pull-up PFET or the second pull-up PFET in response to the data input and the inverted data input being in a logic low state. The buffered level up shifter may further include a bias circuit, a buffer, and an inverter. The bias circuit is used to generate the first bias voltage and the second bias voltage. The buffer has an input coupled to the drain of one of the pair of cross coupled PFETs and a buffered output to buffer a load on the buffered output from the drain of one of the pair of cross coupled PFETs. The I/O circuitry of the integrated circuit includes an output driver having an input coupled to the output of the buffer and a driver output coupled to a pad. The output driver drives the pad with the zero and one logic levels having the high voltage swing. The inverter has an input coupled to the data input and an output coupled to the inverted data input. The inverter inverts the zero and one logic levels of the data input with the low voltage swing generates the inverted data input with one and zero logic levels with the low voltage swing. The PFET of the inverter has a source coupled to the pull-up voltage supply and the NFET of the inverter has a source coupled to ground.

In yet another embodiment of the invention, a tristateable level-up shifter is disclosed that includes a first level up shifter, a second level-up shifter, and tristate control logic. The first level up shifter has a first low swing logic level input and a first high swing logic level output. The second level-up shifter has a second low swing logic level input and a second high swing logic level output.

The tristate control logic couples to the first level up shifter and the second level up shifter. The tristate control logic receives an enable prime signal and a data input having low swing logic levels. The tristate control logic generates a first signal to couple to the first low swing logic level input and a second signal to couple to the second low swing logic level input. The tristate control logic couples the data input to both of the first signal and the second signal in response to the enable prime signal enabling the tristateable level-up shifter. The tristate control logic couples a first disable signal to the first signal and a second disable signal to the second signal in response to the enable prime signal disabling the tristateable level-up shifter.

Each of the first and second level-up shifters include the comparator with the pair of cross coupled PFETs and the differential pair of NFETs to level translate low swing logic levels from the low swing logic level input to high swing logic levels at an intermediate node between the cross coupled PFETs and the differential pair of NFET, and first and second pull-up PFETs to speed the level translation of the low swing logic levels of the low swing logic level input in response to the low swing logic level input and the inverted low swing logic level input. The tristate control logic may include a NOR gate, a first inverter, and a NAND gate. The NOR gate has an output coupled to the first low swing logic level input to generate the first signal thereon, a first input coupled to an enable prime signal, and a second input coupled to a data input which has low swing logic levels. The first inverter has an input coupled to the enable prime signal to invert the enable prime signal into an enable signal at an output. The NAND gate has an output coupled to the second low swing logic level input to generate the second signal thereon, a first input coupled to the output of the first inverter to receive the enable signal, and a second input coupled to the data input having the low swing logic levels.

Figure 1A:
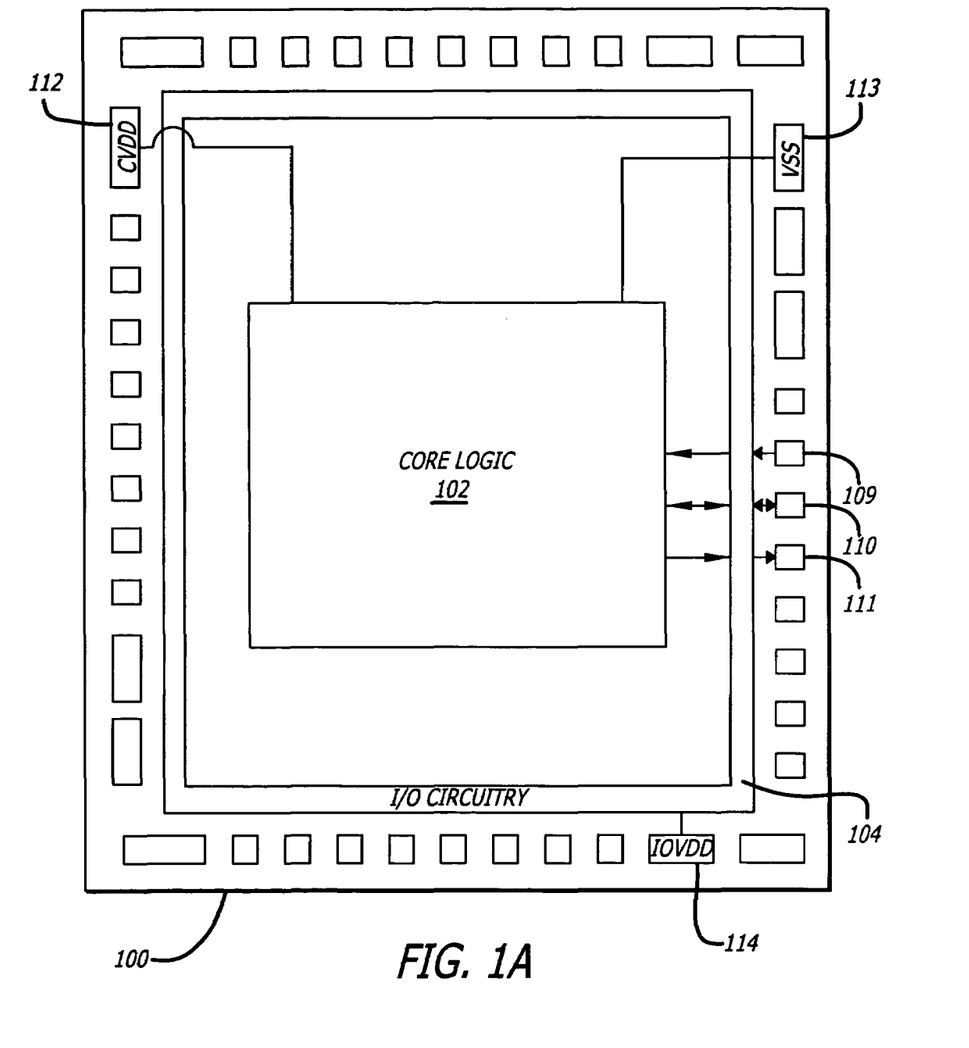
FIG. 1A illustrates a top view of an exemplary integrated circuit with mixed power supply voltages and mixed logic level circuitry.

Referring now to FIG. 1A, a top view of an integrated circuit 100 is illustrated. Integrated circuit 100 includes core logic 102 and I/O circuitry 104. The core logic 102 includes circuitry that operates with a core power supply voltage, coreVDD (CVDD) 112 and a negative power supply of VSS 113, such as ground or zero volts. However, an input/output (I/O or IO) power supply (IOVDD) 114 is used at the edge of the input/output interface of the integrated circuit and coupled to the I/O circuitry 104. The core logic 102 is more central to the integrated circuit while the I/O circuitry 104 is typically closer to the edges as is illustrated in FIG. 1A. A number of wire bonding or contact pads (e.g., pads 109–114) are typically located adjacent the edges of the integrated circuit 100. The contact pads include power supply pads 112–114, output only pads 111, I/O pads 110, and input only pads 109.

The integrated circuit 100 is formed in a modern complementary metal oxide semiconductor (CMOS) fabrication process that includes thick gate and thin gate transistors with minimum channel lengths that allow for small gate-to-source voltages (Vgs), including lower threshold voltages (Vtn and Vtp), and gate-to-drain voltages (Vgd) for the transistors. In this case, the maximum Vgs that the thin gate NFET and PFET can tolerate is about one and a quarter volt (1.25 v). These transistors are widely used in the core logic 102 so that the circuits can switch at high frequencies. In one embodiment of the invention, the minimum channel lengths are on the order of ninety nanometers for thin gate NFETs and ninety nanometer for thin gate PFETs. The small voltages used by the core logic 102 complicate the design of the input/output interface of the integrated circuit 100 as it supports signaling at levels beyond two and one-half volts (2.5 v). The thick gate NFET and PFET can tolerate a higher level of a maximum Vgs to support signaling at levels up to two and one-half volts (2.5 v) and are widely used in the I/O circuitry 104.

At the input, output, and I/O wire bond or contact pads, such as pads 109–111, the logic levels are expected to swing between VSS and IOVDD (referred to as "high swing logic levels"), such as between from approximately zero volts (0 v) to three and one-third volts (3.3 v) nominally. However the core logic using thin transistor gates with lower thresholds and a lower power supply voltage provided by the coreVDD 112, expects to have logic levels ranging between VSS and coreVDD (CVDD) (referred to as "low swing logic levels"), such as between from approximately zero volts (0 v) to one and one-fourth volts (1.25 v) nominally. The negative power supply VSS 113 couples to both the core logic 102 and the I/O circuitry 114. The positive input/output (I/O or IO) power supply IOVDD 114 is nominally three and one-third volts (3.3 v) and couples to the I/O circuitry 104 and the level shifting circuits disclosed herein. The positive power supply coreVDD (CVDD) 112 couples to the core logic 102 and the level shifting circuits disclosed herein. The coreVDD (CVDD) power supply voltage is nominally one and one-quarter volts (1.25 v) in one embodiment of the invention and one and five-hundredths volts (1.05 v) in another embodiment of the invention.

Figure 1B:
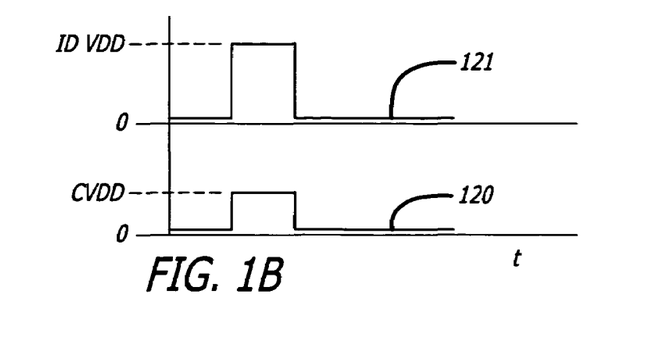
FIG. 1B illustrates waveform diagrams of differing logic level signals.

Referring now to FIG. 1B, waveforms 120 and 121 illustrate the differences between logic levels expected at the contact pads for I/O circuitry and logic levels used in the core logic. At the contact pads, the high swing logic levels are expected to swing back and forth between VSS (e.g., zero volts) and IOVDD (e.g., three and one-third volts (3.3 v) nominally). These high swing logic levels are used within the I/O circuitry 104 to drive and receive such levels. Within the core logic 102, low swing logic levels are expected to swing back and forth between VSS (e.g., zero volts) and coreVDD (CVDD) (e.g., one and one-fourth volts (1.25 v) nominally) within the core logic 102.

When driving signals out from the core logic 102 to the contact pads at the edge of the integrated circuit 100, it is desirable to change the waveform 120 into the waveform 121 at the contact pads. When receiving signals from the contact pads, such as contact pad 109, it is desirable to translate logic levels of waveform 121 into logic levels of waveform 120 for the core logic 102. In this manner the core logic can operate with lower voltages, consume less power and switch at faster frequencies while the I/O circuitry can receive and drive higher logic level voltages for the external integrated circuits to which the integrated circuit 100 may interface.

Figures 2, 3:
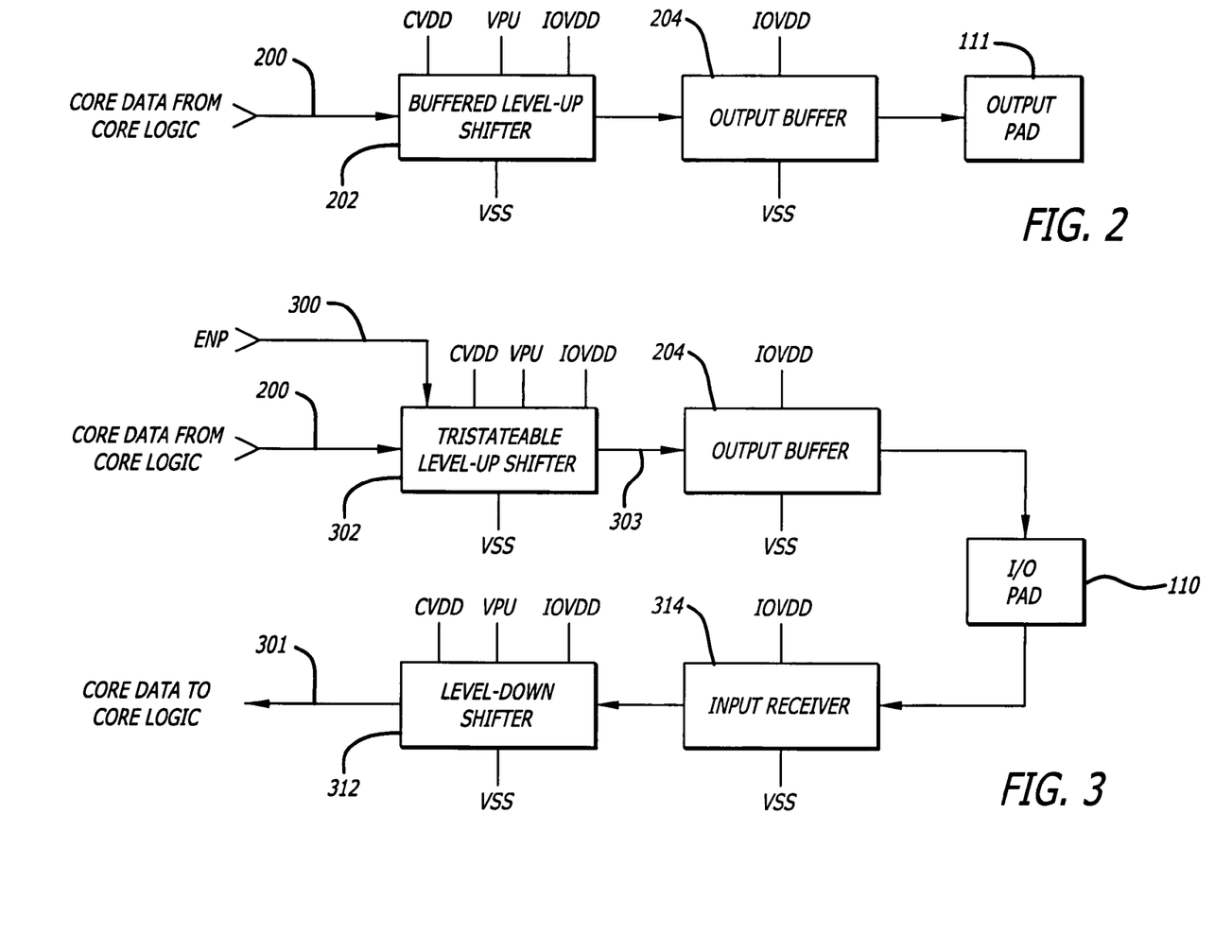
FIG. 2 illustrates a functional block diagram of an output only data flow path with level-up shifting.
FIG. 3 illustrates a functional block diagram of an input/output data flow paths with level shifting.

Referring now to FIG. 2, a block diagram of an output only dataflow path is illustrated. FIG. 2 illustrates an output only pad 111 to which the core data 200 is driven. The core data from the core logic 102 with its low swing logic levels (e.g., between 0 v and 1.25 v nominally) is coupled as an input into the buffered level-up shifter 102. The buffered level-up shifter 102 shifts the logic levels of the core logic 102 (e.g., the low swing logic levels) to the logic levels of the I/O circuitry 104 (e.g., the high swing logic levels) at node 203. The output 203 from the buffered level-up shifter is coupled into an input of the output driver 204. The output driver 204 receives I/O circuit logic levels between 0 and 3.3 volts (e.g., the high swing logic levels) as illustrated in FIG. 1B by waveform 121. The output driver 204 drives the core data with its translated levels onto the output pad 111. In this manner the core logic 102 may function with the logic levels of the waveform 120 (e.g., the low swing logic levels) illustrated in FIG. 1B while the logic levels of the waveform 121 (e.g., the high swing logic levels) are driven onto the output pad 111. The output driver 204 buffers the load on the output pad 111 (e.g., 10 pf capacitor) from the buffered level-up shifter 202.

Referring now to FIG. 3, a block diagram of an input/output data flow between the core logic 102 and the I/O pad 110 is illustrated. In place of the buffered level-up shifter 202, a tristateable level-up shifter 302 is used that receives the core data 200 from the core logic as well as enable prime (ENP) 300 to tristate the output driver into a high impedance state and not drive any signals out onto the pad. An output only data path may include a tristate driver under instances where it is undesirable to constantly drive the output path 111, such as to lower power consumption. The tristateable level-up shifter 302 is coupled to the output driver 204. Signal lines 303 between the tristateable level-up shifter 302 and output driver 204 can either tristate the output driver 204 or drive the I/O pad 110 with data signals representing the core data 200.

The signal enable prime (ENP) 300 is an active low signal such that when it is low, the core data signals 200 are driven out onto the I/O pad 110. It is clear that the enable prime signal (ENP) 300 may be converted to an enable signal (EN), an active high signal, with some minor logic changes, such as by adding an inverter.

To receive data from the I/O pad 110, an input of the input receiver 314 couples to the I/O pad 110. The input receiver receives the I/O circuit logic level signals and couples them into a level down shifter 312. The level-down shifter 312 converts the received input signals at the I/O logic levels illustrated by the waveform 121 in FIG. 1A and converts these to the core logic levels on node 301 as illustrated by the waveform 120 in FIG. 1B. The embodiments of the invention are used in the output data flow path from the core data 200 to the I/O pad 110. Those of ordinary skill in the art will know the details of the input receiver 314 and the level-down shifter 312 in the input data flow path from the I/O data pad 110 to the core data 301 for the core logic and are not included herein for reasons of brevity. Additionally, as the input data flow path is not pertinent to embodiments of the invention, it is not described in greater detail nor are the details of the data flow from the input only pad 109 to the core logic 102 discussed herein.

Figure 4:
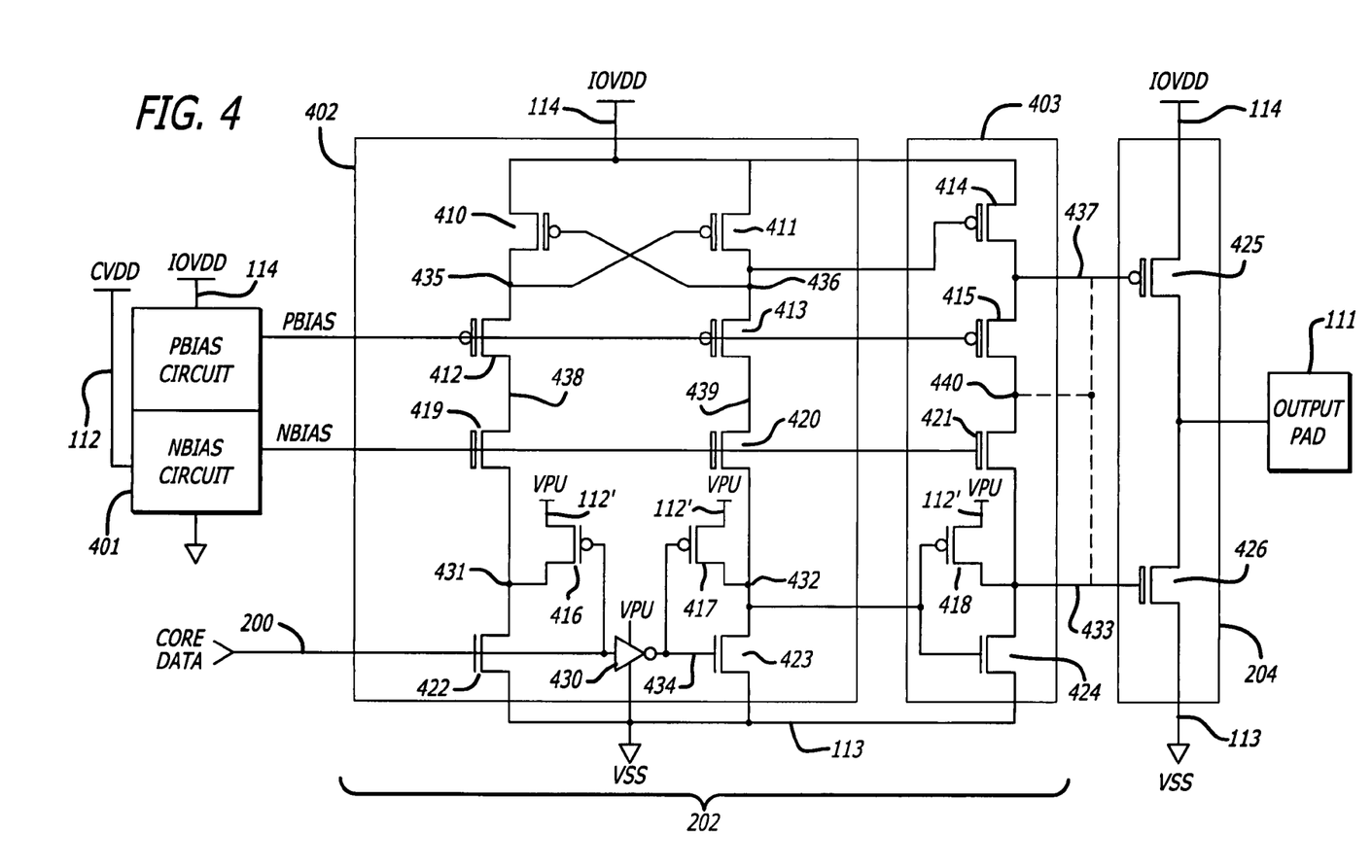
FIG. 4 illustrates a first schematic diagram of the output only data flow path of FIG. 2.

Referring now to FIG. 4, a schematic diagram of the buffered level-up shifter and output driver to drive the output pad 111 is illustrated. The buffered level-up shifter 202 includes a level-up shifter 402 and a buffer stage 403. The level-up shifter 402 and buffer stage 403 receive bias voltages Pbias and Nbias from a bias circuit 401 to bias ON certain cascode transistors.

The bias circuit 401 includes a Pbias circuit to generate the Pbias voltage and an Nbias circuit to generate the Nbias voltage. The bias circuit 401 couples to both the coreVDD (CVDD) 112 and IOVDD 114 to receive their voltages to generate the bias voltages for Pbias and Nbias.

The level-up shifter 402 includes thick gate P-channel field effect transistors (PFETs) 410–413; thick gate N-channel field effect transistors (NFETs) 419–420; thin gate PFETs 416–417; thin gate NFETs 422–423; and a thin gate inverter 430 coupled together as shown and illustrated in FIG. 4. The thin gate inverter 430 is a CMOS inverter with a thin gate PFET and a thin gate NFET coupled together as is well known in the art. The inverter 430 is used to invert the core data signal 200 to generate an inverted core data signal 434.

The buffer 403 includes thick gate PFETs 414–415; a thick gate NFET 421; a thin gate PFET 418; and a thin gate NFET 424 as coupled together and shown in FIG. 4. The PFET 414 is a pull-up PFET with its gate coupled to an output node 436 of the level-up shifter 402, its source coupled to IOVDD 114, and its drain coupled to an output node 437 of the buffer 403. The PFET 415 is a cascode PFET with its gate coupled to the Pbias voltage, its source coupled to the drain of the pull-up PFET 414 and the output node 437, and its drain coupled to an alternate output node 440 of the buffer 403. The NFET 421 is a cascode NFET with its gate coupled to the Nbias voltage, its source coupled to the drain of the NFET 424 and an output node 433, and its drain coupled to the drain of the cascode PFET 415 and the alternate output node 440 of the buffer 403. The NFET 424 is a pull-down transistor (referred to as a pull-down NFET) with its source coupled to ground or VSS, its gate coupled to an output node 432 of the level-up shifter 402, and its drain coupled to the output node 433 of the buffer 403.

In the level-up shifter, the thick gate PFETs 410–411 are a pair of cross-coupled PFETs with their respective gate tied to the other's drain at nodes 436 and 435, and their sources coupled to IOVDD 114. The PFETs 412–413 are cascode PFETs biased by the Pbias voltage coupled to their gates with sources coupled respectively to the drains of PFETs 410–411. The NFETs 419–420 are cascode NFETs in series with the cascode PFETs and are biased by the Nbias voltage coupled to their gates with their drains respectively coupled to the drains 412–413 of the PFETs 412–413, and their sources respectively coupled to the drains of the NFETs 422–423. The NFETs 422–423 form a differential pair with the gate of NFET 422 coupled to Core Data 200 and the gate of NFET 423 coupled to the inverted Core Data 434 generated by the inverter 430. The sources of the NFETs 422–423 are coupled to ground or VSS while their drains couple to the sources of the cascode NFETs 419–420, respectively.

The cross-coupled PFETs 410–411 and the differential pair of NFETs 422–423, with or without the cascode PFETs 412–413 and the cascode NFETs 419–420 coupled between them, may be referred to as a comparator.

While the cascode PFETs and cascode NFETs minimize electrical stresses across the transistors in the pull-up and pull-down paths, their stacked nature tends to slow the transition times in the level-up shifter and anywhere else they may be used. A slow transition time of an output signal in response to changes in an input signal are typically unacceptable for high frequency and low jitter tolerant input/outputs. To compensate, the pull-up PFETs 416–418 have been added to each leg of the level-up shifter 402 and the buffer 403.

The pull-up PFETs 416–418 have sources coupled to a pull-up voltage supply VPU 112', gates coupled to the respective gate of the complementary NFETs 422–424, and drains coupled to the intermediate node in each leg that is desirous to pull-up, nodes 431–433 to which the respective drain of the complementary NFETs 422–424 are coupled, for example.

Providing the pull-up PFETs 416–418 to pull-up on the intermediate nodes 431–433 improves the transition time in a couple of ways. When core data 200 is logically low, the intermediate node 431 is pulled-up to a voltage level of VPU after one transistor delay. When the inverted core data 434 is logically low, the intermediate node 432 is pulled-up to VPU after one transistor delay. When the output of the level shifter 402 is logically low, the intermediate node 433 is pulled-up to VPU after one transistor delay. In contrast, a typical level shifter without the pull-up PFETs may only pull the intermediate nodes up after a six transistor delay.

Additionally after the pull-up PFETs have pull-up on the intermediate node 431–433 to VPU (e.g., coreVDD), the respective cascode NFET 419–421 is effectively turned off, provided that VPU is greater than or equal to (Nbias−Vtn) and less than or equal to coreVDD. This is because with the Nbias voltage applied to the gates and the voltage VPU at the source of the NFETs 419–421, the gate-to-source voltage (Vgs) is reduced to the threshold voltage or less. In one embodiment of the invention, a simple biasing scheme may be used with both VPU and Nbias set equal to the voltage level of coreVDD (CVDD) 112 (e.g., Nbias=VPU=CVDD). In another embodiment of the invention, VPU is set to the voltage level of coreVDD and Nbias is set to the voltage of coreVDD plus the threshold voltage of a thick gate NFET (e.g., VPU=CVDD and Nbias=CVDD+Vtn).

With the cascode NFET 419 or 420 effectively turned off, the corresponding cross-coupled PFETs 410 or 411 doesn't see the capacitive load on the intermediate node 431 or 432. This allows the cross-coupled PFETs 410–411 to flip logic states (from logical one to logical zero or logical zero to logical one) more quickly at nodes 435 and 436 and thus reduce the overall delay through the level shifter 402. With the cross-coupled PFETs 410–411 flipping logical states more quickly, the contention between a pull-up path and a pull-down path in each leg is reduced. In the leg with the cascode NFET turned OFF, the pull-up path delay is reduced. In the opposite leg, the pull down path delay is reduced.

In buffer 403 with the cascode NFET 421 effectively turned off, the pull-up PFET 414 doesn't see the capacitive load on the intermediate node 433. This allows the cross-coupled PFET 414 to pull up more quickly on nodes 437,440 and thus reduce the rise time from low to high in the output of the buffer 403.

The output driver 204 includes a thick gate PFET 425 and thick gate NFET 426 coupled together as illustrated to the output pad 111 in FIG. 4. The gate of PFET 425 couples to node 437 and the drain of PFET 414 and the source of PFET 415. The gate of NFET 426 couples to node 433 and the drains of NFET 424 and PFET 418 as well as the source of NFET 421. As illustrated in FIG. 4, node 437 couples into the gate of PFET 425 while node 433 couples to the gate of NFET 426. Alternatively node 440 maybe used to drive both gates of the PFET 425 and NFET 426 in place of nodes 437 and nodes 433.

In an alternate embodiment of the invention, output driver 204' may be used in place of output driver 204. In this case, the gate of PFET 625 is coupled to node 437, the gate of PFET 626 is coupled to Pbias, the gate of NFET 628 is coupled to Nbias, and the gates of PFET 627 and NFET 629 are coupled to node 433. With the cascode NFET and the cascode PFET, the output driver 204' may protect the transistors from excessive voltage level stress.

The sources of the PFETs 410, 411, 414 and 425 are coupled to the positive power supply IOVDD 114 (e.g., 3.3 v). The sources of the NFETs 422, 423, 424, and 426 as well as the NFET of the inverter 430 are coupled to the negative power supply voltage VSS 113.

The positive power supply IOVDD in one embodiment of the invention is a positive 3.3 volt supply with a plus and minus five percent or a plus and minus ten percent variation. A pull-up voltage supply VPU 112' couples to PFETs 416–418 and the PFET of the inverter 430. The pull-up voltage supply VPU 112' is less than or equal to coreVDD (CVDD) 112 and greater than or equal to the Nbias voltage less than the threshold voltage of a thin gate NFET (Vtn). That is, CVDD≧VPU≧(Nbias−Vtn). The PFETs 416–418 pull up nodes 431–433 respectively when driven with the appropriate logic state such that respective cascode NFETs 419–421 are in effect turned off.

The level-up shifter 402 functions to change the logic levels of the core data 200 into I/O logic levels at node 432. Buffer 403 functions to buffer the level shifter from the load of the output driver and its transistors 425 and 526 as well as the interconnect loading on nodes 437 and 433.

In one embodiment of the invention, the voltage generated by the bias circuit 401 on Pbias is set as a function of transistor threshold voltages and the voltage of the power supply IOVDD. In one embodiment of the invention, Pbias is approximately 0.8 volts given that IOVDD is nominally 3.3 volts. The voltage generated on Nbias is set as a function of threshold voltages and the power supply coreVDD (CVDD). In one embodiment of the invention, Nbias is approximately 1.5 volts given that coreVDD (CVDD) is nominally 1.05 volts.

The voltage supply coreVDD (CVDD) may vary plus and minus ten percent from a nominal level of 1.05 over a range from 0.95 volts to 1.11 volts. In an alternative embodiment, the coreVDD (CVDD) has a nominal level of 1.25 volts with a plus and minus ten percent variation over a range from 1.15 to 1.32 volts. The IOVDD power supply has a nominal value of 3.3 volts with a variation of plus or minus ten percent over a range from 3 volts to 3.6 volts.

The operation of the level-up shifter 402 is now described. Assume that the input core data 200 is a logical high, the inverted core data 434 is a logical low, and the level-up shifter has reached a steady state. In this steady state with NFETs 422,419 turned ON and PFETs 410,412 effectively turned OFF, nodes 431, 438, are substantially at VSS and node 435 is near VSS at a voltage of approximately the voltage level of Pbias plus a threshold voltage of the thick gate cascode PFET 412. With PFETs 411, 413, and 417 turned ON and NFETs 420,423 effectively turned OFF, nodes 436 and 439 are substantially at a voltage level of IOVDD and node 432 is at a voltage level of VPU (e.g., CVDD).

Now assume that the input core data signal 200 changes state from a logical high to a logical low such that the inverted core data signal 434 changes state from a logical low to a logical high. At node 431, NFET 422 turns OFF and PFET 416 turns ON to pull-up on node 431 to a voltage level of VPU 112' (e.g., CVDD). The voltage level of VPU and the voltage level of Nbias are set such that NFET 419 is effectively turned OFF isolating nodes 438 and 435 from node 431. At node 432, PFET 417 turns OFF and NFET 423 turns ON to pull-down on node 432 to the voltage level of VSS 113 (e.g., ground or zero volts). With NFET 413 turned on from the Nbias, the voltage level of VSS is transferred through to node 439.

Initially when node 436 is at a voltage level of IOVDD, cascode PFET 413 is turned ON. In this state, the reduction in voltage on node 439 towards the voltage level of VSS, is transferred through to node 436 until a level is reached where the PFET 413 is effectively turned OFF. PFET 413 effectively turns OFF at a voltage on node 436 of approximately Pbias plus the threshold voltage of the PFET 413.

While node 436 is being reduced in voltage, the gate of PFET 410 cross-coupled thereto tracks the voltage change and turns ON to pull-up on node 435. With the gate of the PFET 411 cross-coupled to node 435, as node 435 is pull-up towards IOVDD by the PFET 410, PFET 411 is turned OFF.

With PFET 412 effectively turned ON by Pbias at its gate, the voltage change in node 435 is transferred through to node 438.

The operation of the buffer stage 403 is simpler than the operation of the level-up shifter 402 as it only has one stage or leg. The buffer stage 403 acts somewhat like an inverter but with some added complexity.

When node 432 goes low to the voltage level of VSS, NFET 424 turns OFF and PFET 418 turns ON pulling up on node 433 effectively turning NFET 421 OFF and isolating nodes 437,440 from node 433. When node 436 goes low in the direction of the voltage level of VSS, PFET 414 is turned ON to pull up on node 427. With PFET 415 turned ON from the Pbias at its gate, the rise in voltage at node 437 is transferred through to node 440 but not node 433 with NFET 421 turned OFF.

When node 436 goes high to the voltage level of IOVDD and node 432 goes high to the voltage level of VPU, PFETs 414,418 are turned OFF and NFET 424 is turned ON. NFET 424 pulls down on node 433 reducing its voltage to VSS. With Nbias applied to the gate of NFET 421, the reduction in voltage on node 433 is transferred through to node 440 to drive it to VSS.

Initially when node 437 is at a voltage level of IOVDD, cascode PFET 415 is turned ON. In this state, the reduction in voltage on node 440 towards the voltage level of VSS is transferred through to node 437 until a level is reached where the PFET 415 is effectively turned OFF. PFET 415 effectively turns OFF at a voltage on node 436 of approximately Pbias plus the threshold voltage of the PFET 415.

As the voltage on node 436 is not fully driven to the voltage of VSS, the drive to PFET 425 may be somewhat reduced and thus it should be sized accordingly. Similarly as the voltage on node 433 is not pulled up fully to IOVDD but only to VPU, the drive to NFET 426 may be somewhat reduced and thus it should be sized accordingly. Although node 440 is pulled up and pulled down at a slower rate than nodes 437,433 respectively, node 440 substantially achieves the voltage levels of IOVDD and VSS in the corresponding logic states. Thus, node 440 may be an alternate node to which to couple the gates of the PFET 425 or the NFET 426.

The buffer 403 couples to the level-up shifter 402 at the intermediate nodes 432,436. These intermediate nodes 432, 436 may not swing through the full range of voltages of the high swing logic signals such as between IOVDD to VSS. However, the intermediate nodes 438,439 of the level shifter do swing through the full range of voltages of the high swing logic signals such as between IOVDD to VSS. Similarly nodes 437,433 may not swing through the full range of voltages of the high swing logic signals. However, the intermediate node 440 and the output pad 111 do swing through the full range of voltages of the high swing logic signals such as between IOVDD to VSS.

Figure 5:
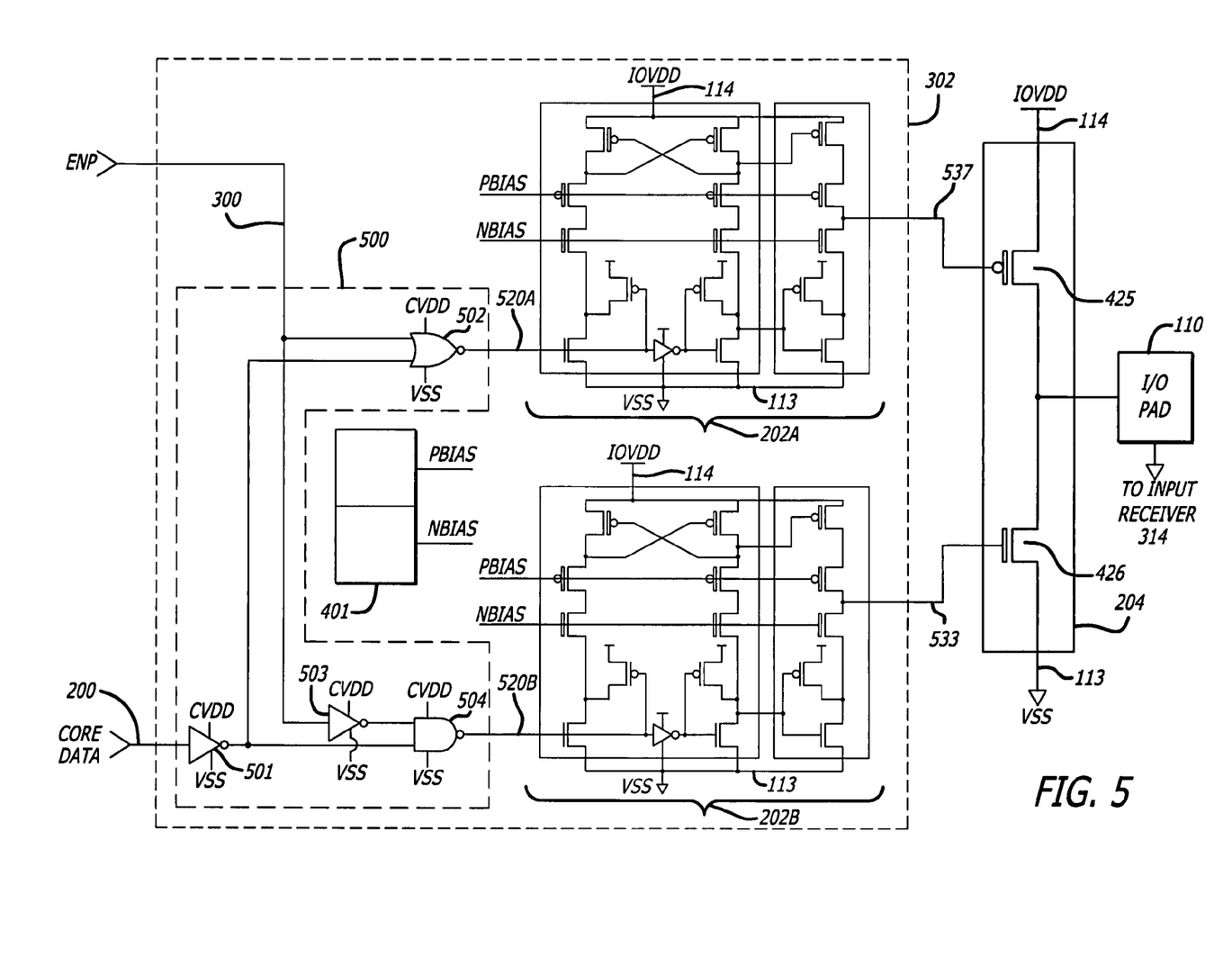
FIG. 5 illustrates a schematic diagram of the output data flow path of FIG. 3.

Referring now to FIG. 5, a schematic diagram of an input/output data path is illustrated. The output data path includes the tristateable level-up shifter 302 coupled to the output driver 204 that is in turn coupled to the I/O pad 110. In the output data path, the tristateable level-up shifter 302 can tristate the output driver 204 using appropriate levels coupled to the inputs of the output driver 204. In the abbreviated illustration of the input data path, the input receiver 314 also couples to the I/O pad 110 to receive an input signal. The input receiver then couples the received data to a level-down shifter so that the appropriate logic levels may be sent to the core logic. The input receiver 314 may be unused in some cases where it is desirable to have an output only tristateable pad.

The tristateable level-up shifter 302 includes a first buffered level-up shifter 202A, a second buffered level-up shifter 202B, the bias circuit 401, the output driver 204, and logic gates 501–504 to control the tristating of the output driver 204. As discussed previously, the bias circuit 401 generates the bias voltages Pbias and Nbias which are coupled to the buffered level-up shifters 202A and 202B.

The level-up shifter 202A has an output coupled to node 537 that couples to the gate of the thick gate PFET 425 of the output driver 204. Level-up shifter 202B has an output coupled to node 533, which is coupled to the gate of the thick gate NFET 426. Further details of the level-up shifters 202A and 202B was previously described with reference to the buffered level-up shifter 202 of FIG. 4.

The gates 501–504 is an example of the tristate control logic that may be used to control the tristating of the output driver 204 or 204'. When the tristateable level-up shifter is to be enabled in response to ENP 300 being a logical low, the tristate control logic 500 is transparent and allows the core data 200 to pass through onto the data inputs 520A–520B and into the pair of level-up shifters 202A–202B. When the tristateable level-up shifter is to be disabled in response to ENP 300 being a logical high, the tristate control logic 500 generates a first disable signal on data input 520A to turn OFF the PFET 425 and a second disable signal on data input 520B to turn OFF the NFET 426. With the level-up shifters 202A–202B having an inversion from input to output, the first disable signal on data input 520A is a logical low to generate a logical high at the node 537 and turn OFF the PFET 425; and the second disable signal on data input 520B is a logical high to generate a logical low at the node 533 and turn OFF the NFET 426.

In one embodiment of the invention, the tristate control logic 500 includes an inverter 501, a NOR gate 502, an inverter 503, and a NAND gate 504 coupled together with other elements as shown and illustrated in FIG. 5. The inverter 501 has an input coupled to the core data 200 to invert it at a first input to the NOR gate 501 and the NAND gate 504 so that the output data path is a non-inverting path from core data 200 to the I/O pad 110. The enable prime signal (ENP) 300 couples to a second input of the NOR gate 502 and an input of the inverter 503. The output of the inverter 503, an enable signal (EN), couples to a second input of the NAND gate 504. The output of the NOR gate 502 is coupled to the date input 520A of the buffered level-up shifter 202A. The output of the NAND gate 404 is coupled to the data input 520B of the buffered level-up shifter 202B. The function of the buffered level-up shifters 202A and 202B is to convert the core logic level signals received from the NOR gate 502 and NAND gate 504 to the I/O logic levels on nodes 537, 533 respectively.

As discussed previously the buffered level-up shifters 202A and 202B receive the IOVDD 114 power supply and the negative power supply VSS 113. The level-up shifters 202A–202B further receive the Pbias and Nbias voltage levels generated by the bias circuit 401.

When enable prime (ENP) 300 is active low, the NOR gate 502 and the NAND gate 504 are transparent such that core data 200 is coupled onto nodes 520A and 520B. The buffered level-up shifters 202A–202B invert the core logic level signals (e.g., low swing logic levels) received from the NOR gate 502 and NAND gate 504 and level translate them to the I/O logic level signals (e.g., high swing logic levels) on nodes 537, 533 respectively.

When enable prime (ENP) 300 is high, NOR gate 502 pulls down on node 520A regardless of the core data signal 200 such that the level-up shifter 202A inverts and level translates it into an I/O high logic level at the output node 537. The I/O high logic level on node 537 turns OFF PFET 425 of the output driver setting it into a high-impedance state. With enable prime being a high logic level, inverter 503 inverts it to a low logic level that is coupled into the NAND gate 504. The NAND gate 504, in response to the low logic level from the inverter 503, pulls up on node 520B regardless of the core data signal 200. With node 520B in a logical one state, the buffered level-up shifter 202B inverts it into a logical zero state on node 533 that is coupled to the gate of NFET 426. A low level or logical zero on node 533 turns OFF NFET 426. Thus when enable prime (ENP) is a high logic level, both the PFET 425 and the NFET 426 of the output driver 204 are turned OFF. This effectively tristates the output driver 204 into a high impedance state so that the I/O pad 110 is not driven in response to any change in the core data signal 200.

As discussed previously, the tristateable level-up shifter 302 includes the inverter 501 to invert the core data 200 so that the output data path is a non-inverting data path. If the level-up shifter and the output driver are to invert the core data signal 200 at the wire bond pad, then inverter 501 may be eliminated and the core data signal 200 may be coupled directly to NOR gate 502 and NAND gate 504.

In an alternate embodiment of the invention, output driver 204' may be used in place of output driver 204 illustrated in FIG. 5. In this case, the gate of PFET 625 is coupled to node 537, the gate of PFET 626 is coupled to Pbias, the gate of NFET 628 is coupled to Nbias, and the gates of PFET 627 and NFET 629 are coupled to node 533. With the cascode NFET and the cascode PFET, the output driver 204' may protect the transistors from excessive voltage level stress.

Figure 6:
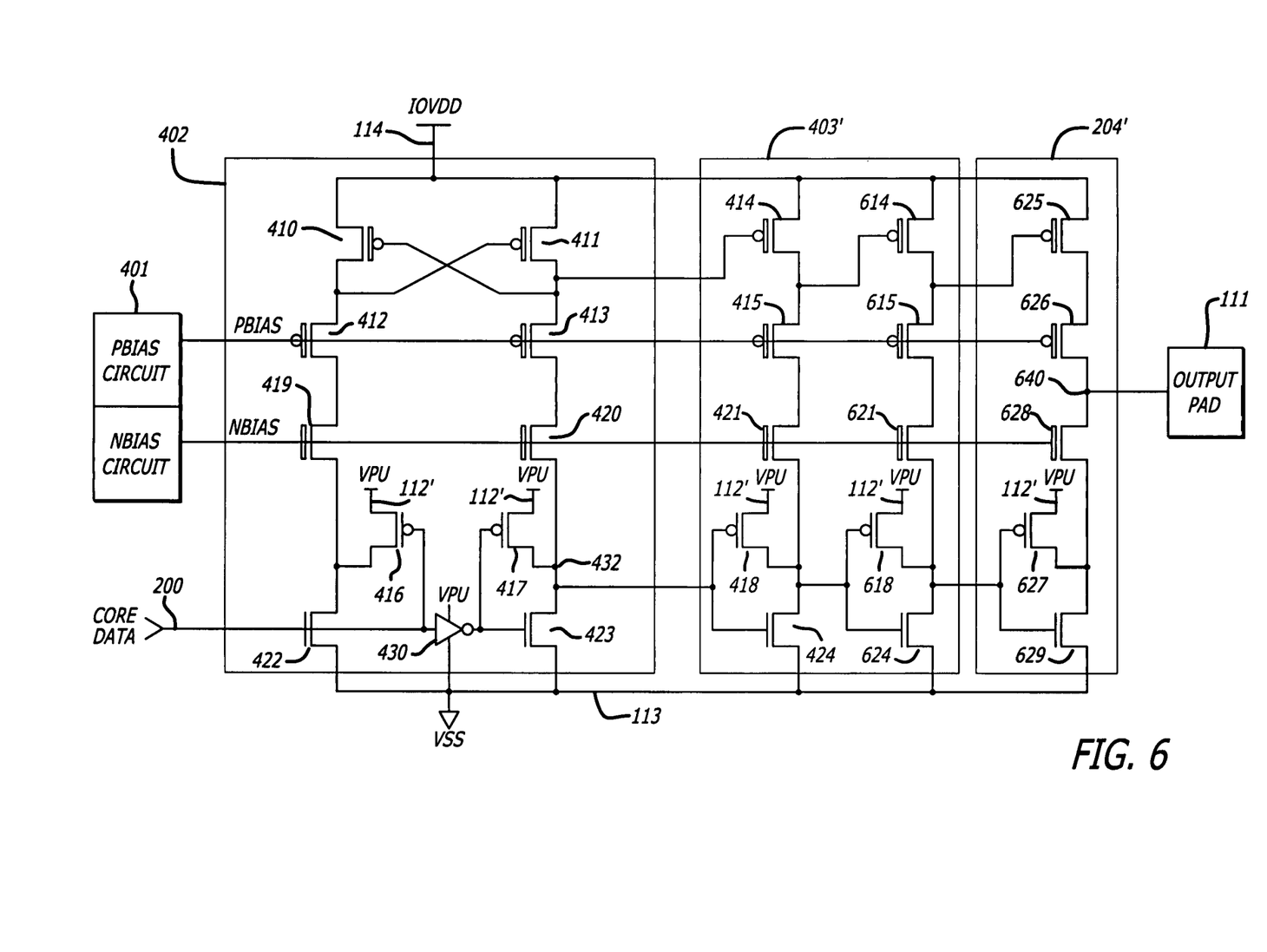
FIG. 6 illustrates a second schematic diagram of an output only data flow path of FIG. 2.

Referring now to FIG. 6, a schematic of a horizontal or a vertical video synch buffer is illustrated. The synch buffer illustrated in FIG. 6 uses the level-up shifter 402 to drive a horizontal or a vertical video synchronization signal from the core logic to the pad 111. As illustrated in FIG. 6, the level-up shifter 402 need not be modified and includes the transistors and operates similarly as was previously described with reference to FIG. 4. The same bias circuit 401 may be used to generate the bias voltages of Pbias and Nbias that are coupled to the PFETS and NFETS as shown in FIG. 6. However, the buffered level-up shifter of FIG. 6 includes a slightly different buffer stage 403' and a slightly different output driver 204' to drive the output pad 111.

For horizontal and vertical synch outputs from an integrated circuit, a one logic level has a minimum voltage of two and four-tenths volts (2.4 v) and a maximum voltage of five and one-half volts (5.5 v). For a zero logic level, the output voltage has minimum voltage of zero volts (0 v) and a maximum voltage of one-half volt (0.5 v). Additionally the maximum fall and rise time is limited to two nano-seconds (2 ns). The amount of jitter measured between pulses is limited to three hundred seventy five pico-seconds (375 ps) with a four hundred megahertz (400 MHz) display phase locked loop (PLL) clock. The target frequency of the output data path is a frequency of one hundred kilohertz (100 Khz) with a ten pico-farad (10 pf) capacitor coupled to the output pad 111. However, the buffered level-up shifter may be used at much greater frequencies such as six hundred megahertz (600 MHz)

To accomplish these specifications, the buffer 403' includes the transistors 414, 415; 421; 418; and 424 previously described with reference to buffer 403 of FIG. 4. Buffer 403' further includes an additional buffer stage or leg consisting of PFETS 614, 615; NFET 621; PFET 618; and NFET 624 that are another instance of the transistors respectively of the buffered stage 403.

The output driver 204' is different in that instead of a simple inverter configuration, the transistors are another instance of the transistors of the buffered stage 403 but may be configured with different sizes. The output driver 204' includes thick gate PFETs 625 and 626, thin gate PFETs 627, thick gate NFETs 628, and thin gate NFETS 629 coupled together as illustrated in FIG. 6. In the output driver 204', node 640 is coupled to the drain of PFET 626, the drain of NFET 628, and to the output pad 111. The additional buffering stages in the buffer 403' inverts the core data signal 200 at the output pad 111. That is, there are an odd number of inversions in the schematic of FIG. 6.

Otherwise, the level shifter 402 and the buffer 403' operate similarly to the buffered-level shifter 202. As the output driver 204' is more similar to the buffer 403 than an inverter, the output driver operates similarly to the buffer 403 while still providing an inversion at its output node 640 which is coupled to the pad 111. That is, PFETs 416, 417, 418, 618, and 627, pull up their respective drains at intermediate nodes in each leg to effectively turn off the cascode NFETS 419–421, 621, and 628 respectively when the gate of the respective PFET is driven low. In this manner, the capacitive load viewed by the PFETs 412–415,615,626 is effectively reduced to speed up the level-up shifter, the buffer, and the output driver.

In comparison with a typical level-up shifter, the embodiments of the invention can reduce the rise and fall delays and rise and fall transition times. The embodiments of the invention can speed up the level-up shifting of logic levels and meet high frequency and low jitter requirements.

While certain exemplary embodiments of the invention have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus comprising:
   a comparator having a pair of cross coupled PFETs with sources coupled to an I/O power supply, and a differential pair of (NFETs) with sources coupled to ground and gates respectively coupled to a data input and an inverted data input, wherein the cross coupled PFETs and the differential pair of NFETs to level translate low swing logic levels at the data input to high swing logic levels on a node between the pair of cross coupled PFETs and the differential pair of NFETs;
   first and second pull-up PFETs with sources coupled to a pull-up voltage supply and drains respectively coupled between the differential pair of NFETs and the pair of cross coupled PFETs, the first and second pull-up PFETs to speed the level translation on the node in response to the data input and the inverted data input; and
   a buffer having an input coupled to the drain of one of the pair of cross coupled PFETs and a buffered output, the buffer to buffer a load on the buffered output from the input, wherein the buffer includes:
   a first PFET with a source coupled to the I/O power supply and a gate coupled to the drain of one of the pair of cross coupled PFETs;
   a first cascode PFET with a source coupled to the drain of the first PFET and a gate coupled to the first bias voltage;
   a first cascode NFET with a drain coupled to the drain of the first cascode PFET and a gate coupled to the second bias voltage;
   a first pull-down NFET with a drain coupled to the source of the first cascode NFET, a source coupled to ground, and a gate coupled to the drain of one of the differential pair of NFETs; and
   a third pull-up PFET with a drain coupled to the drain of the first pull-down NFET, a source coupled to the pull-up voltage supply, and a gate coupled to the drain of the one of the differential pair of NFETs.

2. The apparatus of claim 1, wherein
   the comparator further has a pair of cascode PFETs coupled between the cross coupled PFETs and the differential pair of NFETs, the pair of cascode PFETs biased ON by a first bias voltage.

3. The apparatus of claim 2, wherein
   the comparator further has a pair of cascode NFETs coupled between the pair of cascode PFETs and the differential pair of NFETs, the pair of cascode NFETs biased ON by a second bias voltage with each selectively turned OFF by the respective first and second pull-up PFETs in response to the data input and the inverted data input being a logic low level.

4. The apparatus of claim 3, further comprising:
   a bias circuit to generate the first bias voltage and the second bias voltage.

5. The apparatus of claim 1, further comprising:
   a buffer having an input coupled to the drain of one of the pair of cross coupled PFETs and a buffered output, the buffer to buffer a load on the buffered output from the drain of one of the pair of cross coupled PFETs.

6. The apparatus of claim 5, further comprising:
   an output driver having an input coupled to the buffered output of the buffer and a driver output coupled to a pad of an integrated circuit, the output driver to drive the pad with the high swing logic levels.

7. The apparatus of claim 1, further comprising:
   an inverter having an input coupled to the data input and an output coupled to the inverted data input, the inverter to invert the low swing logic levels of the data input to invert the data input and generate the inverted data input with low swing logic levels.

8. The apparatus of claim 7, wherein
   the inverter has a PFET with a source coupled to the pull-up voltage supply and an NFET with a source coupled to ground.

9. The apparatus of claim 1, wherein
   the pull-up voltage supply is a positive power supply voltage for core logic of an integrated circuit having a voltage level less than a voltage level of the I/O power supply.

10. A level-up shifter comprising:
    a pair of cross coupled p-channel field effect transistors (PFETs) with sources coupled to an I/O power supply and gates cross coupled to the drains;
    a pair of cascode PFETs with sources coupled respectively to the drains of the cross coupled PFETs and gates coupled to a first bias voltage;
    a pair of cascode n-channel field effect transistors (NFETs) with drains respectively coupled to the drains of the pair of cascode PFETs and gates coupled to a second bias voltage;

a differential pair of NFETs with drains respectively coupled to sources of the pair of cascode NFETs, sources coupled to ground, a first gate coupled to a data input, and a second gate coupled to an inverted data input;

first and second pull-up PFETs with drains respectively coupled to the drains of the differential pair of NFETs, sources coupled to a pull-up voltage supply, a first gate coupled to the data input, and a second gate coupled to the inverted data input;

wherein logic levels of the data input have a lower range of swing than logic levels generated at a pair of intermediate nodes where the drains of the pair of cascode PFETs and the drains of the pair of cascode NFETs respectively couple together; and a buffer having an input coupled to the drain of one of the pair of cross coupled PFETs and a buffered output, the buffer to buffer a load on the buffered output from the input, wherein the buffer includes a first PFET with a source coupled to the I/O power supply and a gate coupled to the drain of one of the pair of cross coupled PFETs;

a first cascode PFET with a source coupled to the drain of the first PFET and a gate coupled to the first bias voltage;

a first cascode NFET with a drain coupled to the drain of the first cascode PFET and a gate coupled to the second bias voltage;

a first pull-down NFET with a drain coupled to the source of the first cascode NFET, a source coupled to ground, and a gate coupled to the drain of one of the differential pair of NFETs; and a third pull-up PFET with a drain coupled to the drain of the first pull-down NFET, a source coupled to the pull-up voltage supply, and a gate coupled to the drain of the one of the differential pair of NFETs.

11. The level-up shifter of claim 10, further comprising:
a bias circuit to generate the first bias voltage and the second bias voltage.

12. The level-up shifter of claim 10, wherein
the first pull-up PFET having the first gate coupled to the data input and pulls-up on one of the sources of the pair of cascode NFETs to turn OFF the respective NFET of the pair of cascode NFETs in response to the data input being a logic low level.

13. The level-up shifter of claim 10, wherein
the second pull-up PFET having the second gate coupled to the inverted data input and pulls-up on one of the sources of the pair of cascode NFETs to turn OFF the respective NFET of the pair of cascode NFETs in response to the inverted data input being a logic low level.

14. The level-up shifter of claim 10, further comprising:
an inverter having an input coupled to the data input and an output coupled to the inverted data input, the inverter to invert the logic levels of the data input to generate the logic levels of the inverted data input.

15. The level-up shifter of claim 14, wherein
the inverter has a PFET with a source coupled to the pull-up voltage supply and an NFET with a source coupled to ground.

16. The level-up shifter of claim 10, further comprising:
an output driver having an input coupled to the output of the buffer and an output coupled to a pad of an integrated circuit.

17. The level-up shifter of claim 10, wherein
the buffer further includes
a second PFET with a source coupled to the I/O power supply and a gate coupled to the drain of the first PFET of the buffer;

a second cascode PFET with a source coupled to the drain of the second PFET and a gate coupled to the first bias voltage;

a second cascode NFET with a drain coupled to the drain of the second cascode PFET and a gate coupled to the second bias voltage;

a second pull-down NFET with a drain coupled to the source of the second cascode NFET, a source coupled to ground, and a gate coupled to the drain of the first pull-down NFET; and a fourth pull-up PFET with a drain coupled to the drain of the second pull-down NFET, a source coupled to the pull-up voltage supply, and a gate coupled to the drain of the first pull-down NFET.

18. The level-up shifter of claim 17, further comprising:
an output driver having an input coupled to the output of the buffer and an output coupled to a pad of an integrated circuit.

19. The level-up shifter of claim 18, wherein
the output driver includes
a third PFET with a source coupled to the I/O power supply and a gate coupled to the drain of the second PFET of the buffer;

a third cascode PFET with a source coupled to the drain of the third PFET and a gate coupled to the first bias voltage;

a third cascode NFET with a drain coupled to the drain of the third cascode PFET and a gate coupled to the second bias voltage;

a third pull-down NFET with a drain coupled to the source of the third cascode NFET, a source coupled to ground, and a gate coupled to the drain of the second pull-down NFET; and a fifth pull-up PFET with a drain coupled to the drain of the third pull-down NFET, a source coupled to the pull-up voltage supply, and a gate coupled to the drain of the second pull-down NFET.

20. The level-up shifter of claim 19, wherein
the pull-up voltage supply is a core power supply voltage for core logic circuitry of an integrated circuit having a voltage level less than a voltage level of the I/O power supply.

21. An integrated circuit comprising:
core logic circuitry having a core power supply to generate signals with zero and one logic levels having a low voltage swing;

input/output circuitry having an I/O power supply to drive out signals from the integrated circuit with zero and one logic levels having a high voltage swing greater than the low voltage swing of the signals generated by the core logic circuitry; and a buffered level-up shifter coupled between the core logic circuitry and the input/output circuitry, the buffered level up shifter including a comparator having
a pair of cross coupled p-channel field effect transistors (PFETs) with sources coupled to an I/O power supply and gates cross coupled to each other's drain, and a differential pair of n-channel field effect transistors (NFETs) with sources coupled to ground, drains respectively coupled to the drains of the pair of cross coupled PFETs, and gates respectively coupled to a data input and an inverted data input, wherein the cross coupled PFETs and the differential pair of NFETs to level translate the data input with zero and one logic levels having the low voltage swing to zero and one logic levels having the high voltage swing on a node between the pair of cross coupled PFETs and the differential pair of NFETs, and, a first pull-up PFET with a source coupled to a pull-up voltage supply, a gate coupled to the data input, and a drain coupled to the drain of one of the differential pair of NFETs at a first intermediate node between one of the pair of cross coupled PFETs and the one of the differential pair of NFETs, and a second pull-up PFET with a source coupled to the pull-up voltage supply, a gate coupled to the inverted data input, and a drain coupled to the drain of another one of the differential pair of NFETs at a second intermediate node between another one of the pair of cross coupled PFETs and the another one of the differential pair of NFETs, wherein the first pull-up PFET and the second pull-up PFET to speed the level translation of the data input in response to the data input and the inverted data input, respectively; and a buffer having an input coupled to the drain of one of the pair of cross coupled PFETs and a buffered output, the buffer to buffer a load on the buffered output from the input, wherein the buffer includes a first PFET with a source coupled to the I/O power supply and a gate coupled to the drain of one of the pair of cross coupled PFETs;

a first cascode PFET with a source coupled to the drain of the first PFET and a gate coupled to the first bias voltage;

a first cascode NFET with a drain coupled to the drain of the first cascode PFET and a gate coupled to the second bias voltage;

a first pull-down NFET with a drain coupled to the source of the first cascode NFET, a source coupled to ground, and a gate coupled to the drain of one of the differential pair of NFETs; and a third pull-up PFET with a drain coupled to the drain of the first pull-down NFET, a source coupled to the pull-up voltage supply, and a gate coupled to the drain of the one of the differential pair of NFETs.

22. The integrated circuit of claim 21, wherein the comparator of the buffered level up shifter further includes a pair of cascode PFETs coupled between the cross coupled PFETs and the differential pair of NFETs, the pair of cascode PFETs biased ON by a first bias voltage.

23. The integrated circuit of claim 22, wherein the comparator of the buffered level up shifter further includes a pair of cascode NFETs coupled between the pair of cascode PFETs and the differential pair of NFETs, the pair of cascode NFETs biased ON by a second bias voltage with each selectively turned OFF by the respective first and second pull-up PFETs in response to the data input and the inverted data input being a logic low level.

24. The integrated circuit of claim 21, wherein the buffered level up shifter further includes a bias circuit to generate the first bias voltage and the second bias voltage.

25. The integrated circuit of claim 21, wherein the buffered level up shifter further includes a buffer having an input coupled to the drain of one of the pair of cross coupled PFETs and a buffered output, the buffer to buffer a load on the buffered output from the drain of one of the pair of cross coupled PFETs.

26. The integrated circuit of claim 23, wherein the I/O circuitry includes an output driver having an input coupled to the buffered output of the buffer and a driver output coupled to a pad, the output driver to drive the pad with zero and one logic levels having the high voltage swing.

27. The integrated circuit of claim 21, wherein the buffered level up shifter further includes an inverter having an input coupled to the data input and an output coupled to the inverted data input, the inverter to invert the zero and one logic levels of the data input with the low voltage swing and generate the inverted data input with one and zero logic levels with the low voltage swing.

28. The integrated circuit of claim 27, wherein the inverter has a PFET with a source coupled to the pull-up voltage supply and an NFET with a source coupled to ground.

29. The integrated circuit of claim 21, wherein the pull-up voltage supply is a positive power supply voltage for core logic of an integrated circuit having a voltage level less than a voltage level of the I/O power supply.

30. The integrated circuit of claim 21, wherein the core power supply voltage has a range from nine hundred fifty millivolts to one thousand three hundred twenty millivolts to form the low logic levels with a zero logic level with a voltage in a range from zero millivolts to two hundred fifty millivolts and a one logic level with a voltage in a range from seven hundred fifty millivolts to one thousand three hundred twenty millivolts, and the I/O power supply voltage has a range from three thousand millivolts to three thousand six hundred millivolts to form the high logic levels with a zero logic level with a voltage in a range from zero millivolts to five hundred millivolts and a one logic level with a voltage in a range from two thousand five hundred millivolts to three thousand six hundred millivolts.

31. A tristateable level-up shifter comprising:

a first level up shifter having a first low swing logic level input and a first high swing logic level output;

a second level-up shifter having a second low swing logic level input and a second high swing logic level output;

each of the first and second level-up shifters further includes a buffer having an input coupled to the drain of one of the pair of cross coupled PFETs and a buffered output, the buffer to buffer a load on the buffered output from the drain of one of the pair of cross coupled PFETs:

tristate control logic coupled to the first level up shifter and the second level up shifter, the tristate control logic to receive an enable prime signal and a data input having low swing logic levels, the tristate control logic to generate a first signal to couple to the first low swing logic level input and a second signal to couple to the second low swing logic level input, the tristate control logic coupling the data input to the first signal and the second signal in response to the enable prime signal enabling the tristateable level-up shifter, the tristate control logic coupling a first disable signal to the first signal and a second disable signal to the second signal in response to the enable prime signal disabling the tristateable level-up shifter; and wherein each of the first and second level-up shifters include a comparator having a pair of cross coupled p-channel field effect transistor (PFETs) with sources coupled to an I/O power supply, and a differential pair of n-channel field effect transistor (NFETs) with sources coupled to ground and gates respectively coupled to the low swing logic level input and an inverted low swing logic level input, wherein the cross coupled PFETs and the differential pair of NFETs to level translate low swing logic levels from the low swing logic level input to high swing logic levels at an intermediate node between the cross coupled PFETs and the differential pair of NFETs, and first and second pull-up PFETs with sources coupled to a pull-up voltage supply and drains respectively coupled between the differential pair of NFETs and the pair of cross coupled PFETs, the first and second pull-up PFETs to speed the level translation of the low swing logic levels of the low swing logic level input in response to the low swing logic level input and the inverted low swing logic level input.

32. The tristateable level-up shifter of claim 31, wherein the comparator of each of the first and second level-up shifters further includes a pair of cascode PFETs coupled between the cross coupled PFETs and the differential pair of NFETs, the pair of cascode PFETs biased ON by a first bias voltage, and a pair of cascode NFETs coupled between the pair of cascode PFETs and the differential pair of NFETs, the pair of cascode NFETs biased ON by a second bias voltage with each selectively turned OFF by the respective first and second pull-up PFETs in response to the low swing logic level input and the inverted low swing logic level input being a logic low level.

33. The tristateable level-up shifter of claim 31, further including a bias circuit to generate the first bias voltage and the second bias voltage.

34. The tristateable level-up shifter of claim 31, further comprising:

an output driver having an input coupled to the output of the buffer and a driver output coupled to a pad, the output driver to drive the pad with the high swing logic levels.

35. The tristateable level-up shifter of claim 31, wherein each of the first and second level-up shifters further includes an inverter having an input coupled to the low swing logic level input and an output coupled to the inverted low swing logic level input, the inverter to invert the low swing logic level input and generate the inverted low swing logic level input with low swing logic levels.

36. The tristateable level-up shifter of claim 31, further comprising:

a second inverter coupled between the data input having the low swing logic levels and the tristate control logic, the second inverter to invert the data signal.

37. The tristateable level-up shifter of claim 31, wherein the tristate control logic includes a NOR gate having an output coupled to the first low swing logic level input to generate the first signal thereon, a first input coupled to the enable prime signal, and a second input coupled to the data input having the low swing logic levels, a first inverter having an input coupled to the enable prime signal, the first inverter to invert the enable prime signal into an enable signal at an output, and a NAND gate having an output coupled to the second low swing logic level input to generate the second signal thereon, a first input coupled to the output of the first inverter to receive the enable signal, and a second input coupled to the data input having the low swing logic levels.

* * * * *